United States Patent
Chen (10) Patent No.: US 10,416,739 B2
(45) Date of Patent: Sep. 17, 2019

(54) SHIFT REGISTER UNITS, DRIVING METHODS AND DRIVING APPARATUSES THEREOF, AND GATE DRIVING CIRCUITS

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventor: Yuting Chen, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 228 days.

(21) Appl. No.: 15/531,365

(22) PCT Filed: Jun. 24, 2016

(86) PCT No.: PCT/CN2016/087031
§ 371 (c)(1),
(2) Date: May 26, 2017

(87) PCT Pub. No.: WO2017/161720
PCT Pub. Date: Sep. 28, 2017

(65) Prior Publication Data
US 2018/0335815 A1 Nov. 22, 2018

(30) Foreign Application Priority Data
Mar. 21, 2016 (CN) .......................... 2016 1 0161596

(51) Int. Cl.
*G11C 19/28* (2006.01)
*G09G 3/3266* (2016.01)
(Continued)

(52) U.S. Cl.
CPC ............. *G06F 1/24* (2013.01); *G09G 3/3266* (2013.01); *G09G 3/3677* (2013.01);
(Continued)

(58) Field of Classification Search
CPC ...... G06F 1/24; G09G 3/3266; G09G 3/3677; G09G 2310/0286; G11C 7/04; G11C 19/28
See application file for complete search history.

(56) References Cited

U.S. PATENT DOCUMENTS 8,369,183 B2 3/2013 Yang et al.
8,415,990 B2 4/2013 Liu
(Continued)

FOREIGN PATENT DOCUMENTS

CN 101677021 A 3/2010
CN 102054455 A 5/2011
(Continued)

OTHER PUBLICATIONS

International Search Report and Written Opinion, for PCT Patent Application No. PCT/CN2016/087031, dated Dec. 17, 2016, 23 pages.
(Continued)

*Primary Examiner* — Daniel D Chang
(74) *Attorney, Agent, or Firm* — Kinney & Lange, P.A.

(57) ABSTRACT

The present disclosure relates to a shift register unit, a driving method and a driving apparatus thereof, and a gate driving circuit, wherein the shift register unit comprises an auxiliary output module which can generate a pulse at a first level which is synchronous with the scan pulse to be added to the scan pulse when the valid level corresponding to the auxiliary output module is input to the temperature control voltage terminal, which is beneficial to improve the load capacity of the scan pulse output by the scan pulse output
(Continued)

terminal, thereby enhancing the driving capability of the shift register unit.

20 Claims, 6 Drawing Sheets (51) Int. Cl.
    *G09G 3/36*     (2006.01)
    *G06F 1/24*     (2006.01)
    *G11C 7/04*     (2006.01)

(52) U.S. Cl.
    CPC ....... *G09G 2310/0286* (2013.01); *G11C 7/04* (2013.01); *G11C 19/28* (2013.01)

(56) References Cited

U.S. PATENT DOCUMENTS

| | | | |
|---|---|---|---|
| 9,653,179 B2* | 5/2017 | Wu | G11C 19/28 |
| 2012/0098815 A1 | 4/2012 | Hou et al. | |
| 2014/0119493 A1* | 5/2014 | Yang | G11C 19/28 377/64 |
| 2016/0133211 A1* | 5/2016 | Ma | G11C 19/28 345/205 |

FOREIGN PATENT DOCUMENTS

| | | | |
|---|---|---|---|
| CN | 102063858 A | | 5/2011 |
| CN | 102314828 A | | 1/2012 |
| CN | 102682699 A | | 9/2012 |
| CN | 103050106 A | | 4/2013 |
| CN | 104299590 A | | 1/2015 |
| CN | 104952417 A | | 9/2015 |
| CN | 204946511 U | | 1/2016 |
| CN | 205028635 U | | 2/2016 |

OTHER PUBLICATIONS

First Chinese Office Action dated Mar. 18, 2019, received for corresponding Chinese Application No. 201610161596.2.

* cited by examiner

SHIFT REGISTER UNITS, DRIVING METHODS AND DRIVING APPARATUSES THEREOF, AND GATE DRIVING CIRCUITS

CROSS-REFERENCE TO RELATED APPLICATION(S)

This application is a Section 371 National Stage Application of PCT International Application No. PCT/CN2016/087031, which claims priority to the Chinese Patent Application No. 201610161596.2, filed on Mar. 21, 2016, which is incorporated herein by reference in its entirety.

TECHNICAL FIELD

The present disclosure relates to the field of display technology, and more particularly, to shift register units, driving methods and driving apparatuses thereof, and gate driving circuits.

BACKGROUND

Gate Driver On Array (GOA) is an important measure to achieve a narrow frame of a display apparatus. In general, a gate driving circuit integrated on an array substrate is composed of multiple stages of shift register units, in which each stage of shift register units sequentially shifts and outputs a scan pulse to a gate of a thin film transistor in each row of pixel units, so that the corresponding thin film transistor is turned on, thereby realizing a process of driving each row of pixel units. In some low-temperature environments, performance of some components in the shift register unit may drop significantly due to low temperatures, which results in that a voltage of an output scan pulse does not reach a turn-on level of the corresponding thin film transistor.

SUMMARY

According to a first aspect of the present disclosure, there is provided a shift register unit, comprising:

an output module connected to a first node, a clock signal input terminal and a scan pulse output terminal, and is adapted to output a scan pulse at a first level via the scan pulse output terminal when the first node and the clock signal input terminal are at the first level; and an auxiliary output module connected to the first node, the clock signal input terminal, the scan pulse output terminal and a temperature control voltage terminal, and is adapted to generate a pulse at the first level which is synchronous with the scan pulse and add the pulse at the first level to the scan pulse when both the first node and the clock signal input terminal are at the first level and the temperature control voltage terminal is at a valid level of the auxiliary output module.

Further, the shift register unit further comprises:

an input module connected to the scan pulse input terminal and the first node, and is adapted to set the first node to the first level when the scan pulse input terminal is at the first level;

a reset module connected to a reset control terminal and a direct current low voltage terminal and is adapted to set the first node to a second level when the reset control terminal is at the first level; and a restart module connected to the scan pulse output terminal, the direct current low voltage terminal and the reset control terminal, and is adapted to set the scan pulse output terminal to the second level when the reset control terminal is at the first level.

Further, the input module comprises a first transistor having a gate connected to the scan pulse input terminal, one of a source and a drain connected to the scan pulse input terminal and the other of the source and the drain connected to the first node;

the reset module comprises a second transistor having a gate connected to the reset control terminal, one of a source and a drain connected to the first node and the other of the source and the drain connected to the direct current low voltage terminal;

the output module comprises a third transistor and a first capacitor, wherein the third transistor has a gate connected to the first node, one of a source and a drain connected to the clock signal input terminal and the other of the source and the drain connected to the scan pulse output terminal, and the first capacitor has one terminal connected to the first node and the other terminal connected to the scan pulse output terminal; and the restart module comprises a fourth transistor having a gate connected to the reset control terminal, one of a source and a drain connected to the scan pulse output terminal and the other of the source and the drain connected to the direct current low voltage terminal.

Further, the shift register unit further comprises: an enforcement reset module and/or an enhancement restart module, and a second node control module, wherein, the enforcement reset module is connected to the first node, a second node and the direct current low voltage terminal, and is adapted to set the first node to a second level when the second node is at the first level;

the enforcement restart module is connected to the second node, the scan pulse output terminal and the direct current low voltage terminal, and is adapted to set the scan pulse output terminal to the second level when the second node is at the first level; and the second node control module is connected to the first node, the second node, a high voltage terminal and the direct current low voltage terminal, and is adapted to set the second node to the second level when the first node is at the first level and set the second node to the first level when the first node is at the second level.

Further, the enforcement reset module comprises a fifth transistor having a gate connected to the second node, one of a source and a drain connected to the direct current low voltage terminal, and the other of the source and the drain connected to the first node;

the enforcement restart module comprises a sixth transistor having a gate connected to the second node, one of a source and a drain connected to the scan pulse output terminal, and the other of the source and the drain connected to the direct current low voltage terminal;

the second node control module comprises a seventh transistor, an eighth transistor, a ninth transistor and a tenth transistor, wherein the seventh transistor has a gate connected to a third node, one of a source and a drain connected to the high voltage terminal, and the other of the source and the drain connected to the second node, each of the eighth transistor and the ninth transistor has a gate connected to the first node, the eighth transistor has one of a source and a drain connected to the second node, and the other of the source and the drain connected to the direct current low voltage terminal, the ninth transistor has one of a source and a drain connected to the third node, and the other of the source and the drain connected to the direct current low voltage terminal, the tenth transistor has a gate and one of a source and a drain connected to the high voltage terminal, and the other of the source and the drain connected to the third node.

Further, the auxiliary output module comprises an eleventh transistor, a twelfth transistor and a thirteenth transistor; wherein the eleventh transistor has one of a source and a drain connected to a fourth node, and the other of the source and the drain connected to the scan pulse output terminal, the thirteenth transistor has one of a source and a drain connected to the fourth node, the other of the source and the drain connected to the clock signal input terminal, and a gate connected to the temperature control voltage terminal, and the twelfth transistor has a gate connected to the temperature control voltage terminal, one of a source and a drain connected to a gate of the eleventh transistor, and the other of the source and the drain connected to the first node.

Further, the auxiliary output module comprises an eleventh transistor and a twelfth transistor, wherein the eleventh transistor has one of a source and a drain connected to the clock signal input terminal, and the other of the source and the drain connected to the scan pulse output terminal, and the twelfth transistor has a gate connected to the temperature control voltage terminal, one of a source and a drain connected to a gate of the eleventh transistor, and the other of the source and the drain connected to the first node.

Further, the auxiliary output module comprises an eleventh transistor, a twelfth transistor, a thirteenth transistor and a fourteenth transistor, wherein the eleventh transistor has one of a source and a drain connected to a fourth node, and the other of the source and the drain connected to the scan pulse output terminal;

the twelfth transistor has a gate connected to the temperature control voltage terminal, one of a source and a drain connected to a gate of the eleventh transistor, and the other of the source and the drain connected to the first node;

the thirteenth transistor has a gate connected to a fifth node, one of a source and a drain connected to the fourth node, and the other of the source and the drain connected to the temperature control voltage terminal; and the fourteenth transistor has a gate connected to the clock signal input terminal, one of a source and a drain connected to the temperature control voltage terminal, and the other of the source and the drain connected to the fifth node.

Further, the auxiliary output module further comprises a fifteenth transistor having a gate connected to the second node, one of a source and a drain connected to the fifth node, and the other of the source and the drain connected to the scan pulse output terminal.

Further, the first level is a high level, the second level is a low level, and the first transistor to the fifteenth transistor are N-type transistors.

According to a second aspect of the present disclosure, there is provided a gate driving circuit comprising a plurality of cascaded shift register units, each of the shift register units being the shift register unit according to any of the aspects described above.

According to a third aspect of the present disclosure, there is provided a method for driving the shift register unit according to any of the aspects described above, comprising:

setting the temperature control voltage terminal to the valid level of the auxiliary output module when it is detected that a temperature is lower than a preset value.

According to a fourth aspect of the present disclosure, there is provided an apparatus for driving the shift register unit according to any of the aspects described above, comprising: a temperature control module, configured to set the temperature control voltage terminal to the valid level of the auxiliary output module when it is detected that a temperature is lower than a preset value.

According to a fifth aspect of the present disclosure, there is provided a display apparatus, comprising the array substrate described above.

BRIEF DESCRIPTION OF THE DRAWINGS

The feature information and advantages of the present disclosure will become more apparent with reference to the accompanying drawings, which are illustrative and are not to be construed as limiting the present disclosure. In the accompanying drawings.

DETAILED DESCRIPTION

The present disclosure will now be described in further detail with reference to the accompanying drawings and specific embodiments in order to provide a clearer understanding of the above objects, features and advantages of the present disclosure. It is to be noted that the embodiments of the present application and the features in the embodiments can be combined with each other without conflict.

Many specific details are set forth in the following description so as to fully understand the present disclosure, but the present disclosure can be practiced in other manners than otherwise described herein, and thus the protection scope of the present disclosure is not limited to the specific embodiments disclosed below.

It will be understood by those skilled in the art that the thin film transistor according to the embodiments of the present disclosure may be a P-type switch transistor or an N-type switch transistor, wherein the P-type switch transistor is turned on when a gate thereof is at a low level and is turned off when the gate is at a high level, and the N-type switch transistor is turned on when a gate thereof is at a high level and is turned off when the gate is at a low level. In the embodiments below, the present disclosure will be described by taking N-type transistors as an example. It will be understood by those skilled in the art that the technical solutions according to the embodiments of the present disclosure can be applied in a case of P-type transistors.

Figure 1:
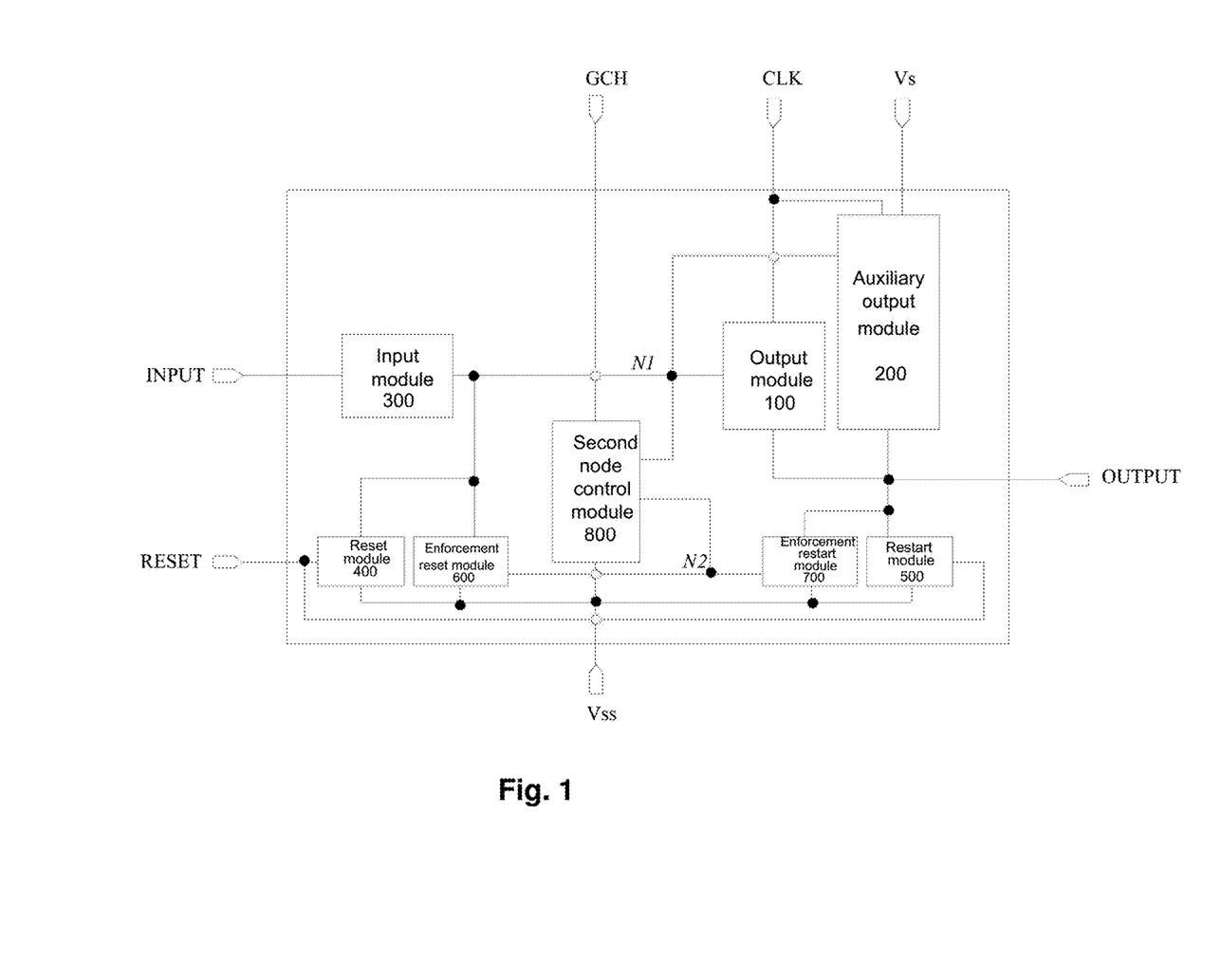
FIG. 1 is a structural diagram of a shift register unit according to an embodiment of the present disclosure.

The embodiments of the present disclosure provide a shift register unit, as shown in FIG. 1, comprising:

an output module 100 connected to a first node N1, a clock signal input terminal CLK and a scan pulse output terminal OUTPUT, and is adapted to output a scan pulse at a high level via the scan pulse output terminal OUTPUT when the first node N1 is at a high level and the clock signal input terminal CLK is at a high level; and an auxiliary output module 200 connected to the first node N1, the clock signal input terminal CLK, the scan pulse output terminal OUTPUT and a temperature control voltage terminal Vs, and is adapted to generate a pulse at a high level which is synchronous with the scan pulse and add the pulse at a high level to the scan pulse when both the first node N1 and the clock signal input terminal CLK are at a high level and the temperature control voltage terminal Vs is at a valid level of the auxiliary output module 200.

The embodiments of the present disclosure further provide a method for driving the shift register unit according to the first aspect. The method may comprise:

setting the temperature control voltage terminal Vs to the valid level of the auxiliary output module 200 when it is detected that a temperature is lower than a preset value.

In this way, when the temperature is lower than the preset value, the auxiliary output module 200 enters a valid state, generates a pulse at a high level which is synchronous with the scan pulse output by the output module 100, and adds the pulse at a high level to the scan pulse, so that the load capability of the scan pulse output by the scan pulse output terminal can be improved, thereby enhancing the driving capability of the shift register unit.

Specifically, the preset value here is set and designed according to practical requirements, for example, the preset value may be set to −10° C. etc. A specific manner to set the preset value here does not influence the protection scope of the present disclosure.

The driving method here can be achieved by software, or can also be achieved by hardware circuits. The present disclosure further provides an apparatus for realizing the driving method described above. The driving apparatus comprises a temperature control module configured to set the temperature control voltage terminal to the valid level of the auxiliary output module when it is detected that the temperature is lower than the preset value.

In a specific implementation, the temperature detection process here can be achieved by a temperature sensor.

Also as shown in FIG. 1, as a preferable implementation, in addition to the output module 100 and the auxiliary output module 200 described above, the shift register unit may further comprise:

an input module 300 connected to the scan pulse input terminal INPUT and the first node N1, and is adapted to set the first node N1 to a high level when the scan pulse input terminal INPUT is at a high level;

a reset module 400 connected to a reset control terminal RESET and a direct current low voltage terminal Vss and is adapted to set the first node N1 to a low level when the reset control terminal RESET is at a high level; and a restart module 500 connected to the scan pulse output terminal OUTPUT, the direct current low voltage terminal Vss and the reset control terminal RESET, and is adapted to set the scan pulse output terminal OUTPUT to a low level when the reset control terminal RESET is at a high level.

Figure 2:
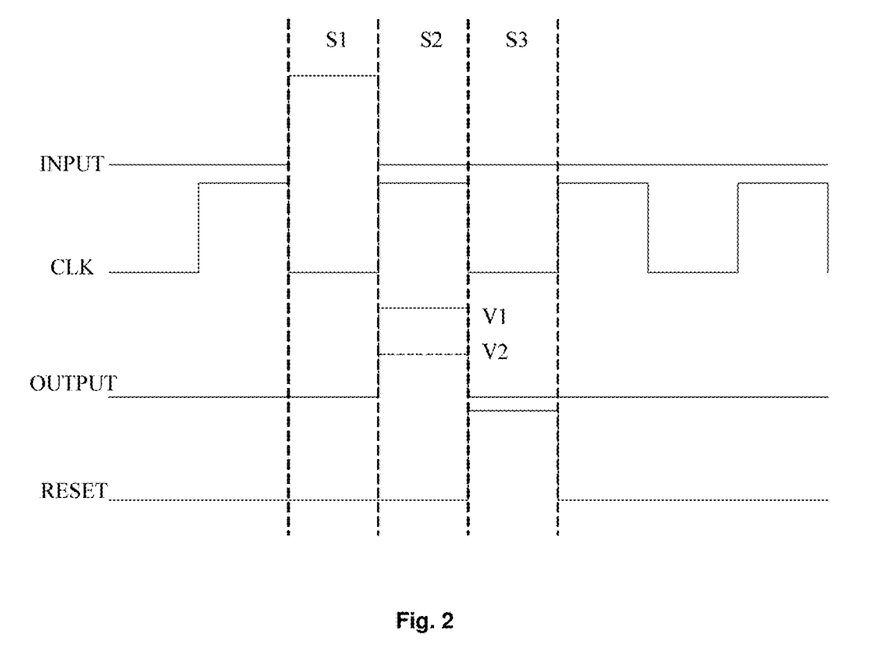
FIG. 2 is a diagram of potentials of key signals and nodes when the shift register unit in FIG. 1 is driven.

As shown in FIG. 2, an operation process of the shift register unit realizing shifting and outputting is as follows.

In a first phase S1 in which the scan pulse input terminal INPUT inputs a scan pulse (the scan pulse is at a high level), the input module 300 sets the first node N1 to a high level, and at the same time, a low level is applied to the clock signal input terminal CLK, so that the output module 100 does not output a high level in this phase.

After the scan pulse is input completely, the process proceeds to a second phase S2 in which the scan pulse is output. In this phase, a high level is applied to the clock signal input terminal CLK, so that the output module 100 outputs a high level via the scan pulse output terminal OUTPUT.

After the phase in which the scan pulse is output, the process proceeds to a third phase S3 in which resetting and restarting steps are performed. At this time, a pulse at a high level is applied to the reset control terminal RESET, so that the reset module 400 sets the first node N1 to a low level, and the restart module 500 sets the scan pulse output terminal OUTPUT to a low level. As a level at the first node N1 is pulled low, the output module 100 does not output a high level in this phase and after this phase until the scan pulse input terminal INPUT inputs a scan pulse in a next frame. In this way, the shift register unit in FIG. 1 completes shifting and outputting of a scan pulse at a high level. At the same time, if the valid level of the auxiliary output module 200 is applied to the temperature control voltage terminal Vs in the above driving process, the auxiliary output module 200 may also output a scan pulse at a high level and add the scan pulse at a high level to the scan pulse output by the output module 100 in the phase S2 in which the scan pulse is output, so that the load capacity of the voltage at the scan pulse output terminal OUTPUT is improved (in FIG. 2, compared with the voltage at the output terminal OUTPUT when the scan pulse at a high level is not added, the voltage at the output terminal OUTPUT is higher, illustrated as V1 in FIG. 2), and the driving capability of the shift register unit is enhanced. If the valid level at the auxiliary output module 200 is not applied to the temperature control voltage terminal Vs in the above driving process, the auxiliary output module 200 does not output a scan pulse at a high level in the second phase S2, and therefore the scan pulse output terminal OUTPUT is at a low voltage (illustrated as V2 in FIG. 2).

Further, as shown in FIG. 1, the shift register unit may further be provided with an enforcement reset module 600, an enforcement restart module 700 and a second node control module 800 for controlling a voltage at the second node N2, wherein, the enforcement reset module 600 is connected to the first node N1, the second node N2 and the direct current low voltage terminal Vss, and is adapted to set the first node N1 to a low level when the second node N2 is at a high level;

the enforcement restart module 700 is connected to the second node N2, the scan pulse output terminal OUTPUT and the direct current low voltage terminal Vss, and is adapted to set the scan pulse output terminal OUTPUT to a low level when the second node N2 is at a high level; and the second node control module 800 is connected to the first node N1, the second node N2, a high voltage terminal GCH and the direct current low voltage terminal Vss, and is adapted to set the second node N2 to a low level when the first node N1 is at a high level and set the second node N2 to a high level when the first node N1 is at a low level.

As when the first node N1 is at a high level, the second node control module 800 sets the second node N2 to a low level, in the first phase S1 and the second phase S2 in which the first node N1 is at a high level, both the enforcement reset module 600 and the enforcement restart module 800 do not perform the corresponding resetting and restarting processes, which ensures that the shift register unit normally outputs a scan pulse. After the level at the first node N1 is pulled low, the second node control module 800 pulls the level at the second node N2 high, so that the enforcement reset module 600 can consecutively set the first node N1 to a low level, which avoids accumulation of positive charges at the first node N1, thereby preventing the accumulation of positive charges at the first node N1 from influencing the display process. After the level at the second node N2 is pulled high, the enforcement restart module 700 can consecutively set the scan pulse output terminal OUTPUT to a low level, which avoids accumulation of positive charges at the scan pulse output terminal OUTPUT, thereby preventing the accumulation of positive charges at the scan pulse output terminal OUTPUT from influencing the display process.

It is to be understood that both the enhancement reset module 600 and the enhancement restart module 700 are not necessarily provided under the premise that the accumulation of charges at the first node N1 and the scan pulse output terminal OUTPUT can be avoided in other manners.

It can be known from the above analysis that, in practical applications, each of the functional modules shown in FIG. 1 can be achieved in a variety of structures, and under the premise that corresponding functions can be achieved, a specific structure used for each functional module does not influence the implementation of the corresponding functions by the shift register unit in FIG. 1. Some specific implementation structures of the various functional modules will be described below with reference to the accompanying drawings.

Figure 3:
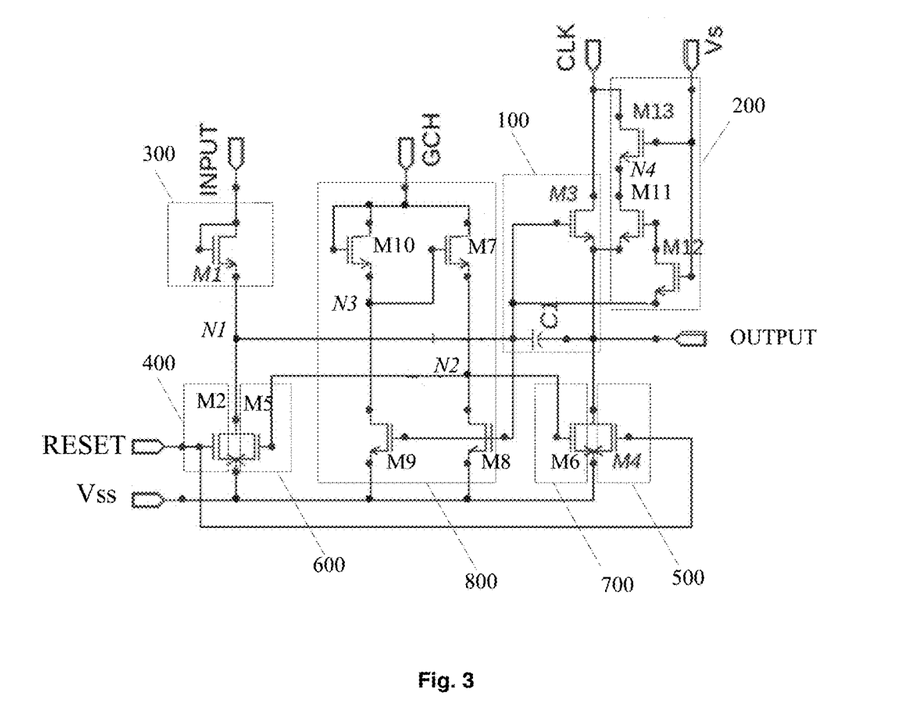
FIG. 3 is a diagram of a possible circuit structure of the shift register unit in FIG. 1.

As shown in FIG. 3, illustrated is a diagram of a possible circuit structure of the shift register unit in FIG. 1. The circuit structure comprises a total of thirteen N-type transistors M1-M13 and a capacitor C1, and has a clock signal input terminal CLK, a scan pulse input terminal INPUT, a scan pulse output terminal OUTPUT, a reset control terminal RESET, a direct current low voltage input terminal Vss, and a temperature control voltage terminal Vs, wherein, a first transistor M1 has a gate connected to the scan pulse input terminal INPUT, one of a source and a drain also connected to the scan pulse input terminal INPUT and the other of the source and the drain connected to the first node N1, wherein the first transistor M1 can conduct a connection between the first node N1 and the scan pulse input terminal INPUT when the scan pulse input terminal INPUT is at a high level, so as to set the first node N1 to a high level, and therefore the first transistor M1 is equivalent to the input module 300;

a second transistor M2 has a gate connected to the reset control terminal RESET, one of a source and a drain connected to the first node N1 and the other of the source and the drain connected to the direct current low voltage terminal Vss, wherein the second transistor M2 can conduct a connection between the first node N1 and the direct current low voltage terminal Vss when the reset control terminal RESET is at a high level, so as to pull a level at the first node N1 low, and therefore the second transistor M2 is equivalent to the reset module 400;

a third transistor M3 has a gate connected to the first node N1, one of a source and a drain connected to the clock signal input terminal CLK and the other of the source and the drain connected to the scan pulse output terminal OUTPUT, and a first capacitor C1 has one terminal connected to the first node N1 and the other terminal connected to the scan pulse output terminal OUTPUT, wherein the third transistor M3 and the first capacitor C1 can conduct a connection between the scan pulse output terminal OUTPUT and the clock signal input terminal CLK when the first node N1 is at a high level and the clock signal input terminal CLK is at a high level, so as to set the scan pulse output terminal OUTPUT to a high level, and therefore the third transistor M3 and the first capacitor C1 are equivalent to the output module 100;

a fourth transistor M4 has a gate connected to the reset control terminal RESET, one of a source and a drain connected to the scan pulse output terminal OUTPUT and the other of the source and the drain connected to the direct current low voltage terminal Vss, wherein the fourth transistor M4 can be turned on when the reset control terminal RESET is at a high level to conduct a connection between the scan pulse output terminal OUTPUT and the direct current low voltage terminal Vss, so as to set the scan pulse output terminal OUTPUT to a low level, and therefore the fourth transistor M4 is equivalent to the restart module 500;

a fifth transistor M5 has a gate connected to the second node N2, one of a source and a drain connected to the direct current low voltage terminal Vss, and the other of the source and the drain connected to the first node N1, wherein the fifth transistor M5 can conduct a connection between the first node N1 and the direct current low voltage terminal Vss when the second node N2 is at a high level, so as to set the first node N1 to a low level, and therefore the fifth transistor M5 is equivalent to the enforcement reset module 600;

a sixth transistor M6 has a gate connected to the second node N2, one of a source and a drain connected to the scan pulse output terminal OUTPUT, and the other of the source and the drain connected to the direct current low voltage terminal Vss, wherein the sixth transistor M6 can conduct a connection between the scan pulse output terminal OUTPUT and the direct current low voltage terminal VSS when the second node N2 is at a high level, so as to set the scan pulse output terminal OUTPUT to a low level, and therefore the sixth transistor M6 is equivalent to the enforcement restart module 700;

a seventh transistor has a gate connected to a third node N3, one of a source and a drain connected to the high voltage terminal GCH, and the other of the source and the drain connected to the second node N2, each of an eighth transistor M8 and a ninth transistor M9 has a gate connected to the first node N1, the eighth transistor M8 has one of a source and a drain connected to the second node N2, and the other of the source and the drain connected to the direct current low voltage terminal Vss, the ninth transistor M9 has one of a source and a drain connected to the third node N3, and the other of the source and the drain connected to the direct current low voltage terminal Vss, and a tenth transistor M10 has a gate and one of a source and a drain connected to the high voltage terminal GCH, and the other of the source and the drain connected to a third node N3; wherein in this way, when the first node N1 is at a high level, the eighth transistor M8 and the ninth transistor M9 are turned on to conduct connections from the second node N2 and the third node N3 to the direct current low voltage terminal Vss, so as to pull voltages at the second node N2 and the third node N3 low, so that the seventh transistor M7 is turned off and the fifth transistor M5 and the sixth transistor M6 are also turned off; and when the first node N1 is at a low level, the eighth transistor M8 and the ninth transistor M9 are turned off and the tenth transistor M10 is turned on, thereby a voltage at the third node N3 is the same as that at the high level terminal GCH, i. e., the voltage at the third node N3 is at a high level, so that the seventh transistor M7 is turned on, and the voltage at the second node N2 is the same as that at the high level terminal GCH, i.e., the voltage at the second node N2 is at a high level. As a result, the seventh transistor M7, the eighth transistor M8, the ninth transistor M9 and the tenth transistor M10 realize the functions of the second node control module 800 as descried above, and therefore are equivalent to the second node control module 800; and an eleventh transistor M11 has one of a source and a drain connected to the fourth node N4, and the other of the source and the drain connected to the scan pulse output terminal OUTPUT, a thirteenth transistor M13 has one of a source and a drain connected to a fourth node N4, and the other of the source and the drain connected to the clock signal input terminal CLK, and each of a twelfth transistor M12 and the thirteenth transistor M13 has a gate connected to the temperature control voltage terminal Vs, and the twelfth transistor M12 has one of a source and a drain connected to the gate of the eleventh transistor M11, and the other of the source and the drain connected to the first node N1. When the temperature control voltage terminal Vs is at a high level, both the twelfth transistor M12 and the thirteenth transistor M13 are turned on, so that a connection between the gate of the eleventh transistor M11 and the first node N1 is conducted, a connection between one of the source and the drain of the eleventh transistor M11 and the clock signal terminal CLK is conducted, and a connection between the other of the source and the drain of the eleventh transistor M11 and the scan pulse output terminal OUTPUT is conducted. In this case, a connection relationship of various electrode terminals of the eleventh transistor M11 fits to that of the third transistor M3, and when the third transistor M3 outputs a scan pulse to the scan pulse output terminal OUTPUT, the eleventh transistor M11 also outputs a synchronous pulse to the scan pulse output terminal OUTPUT to be added to the scan pulse output by the third transistor M3 to form a scan pulse with a higher load capability. When the temperature control voltage terminal Vs is at a low level, the eleventh transistor M11 cannot conduct a connection between the clock signal terminal CLK and the scan pulse output terminal OUTPUT, and therefore cannot output a corresponding pulse at a high level. Thus, the eleventh transistor M11, the twelfth transistor M12 and the thirteenth transistor M13 here realize the functions of the auxiliary output module 200, and are equivalent to the auxiliary output module 200, of which a valid level is a high level and an invalid level is a low level.

Figure 4:
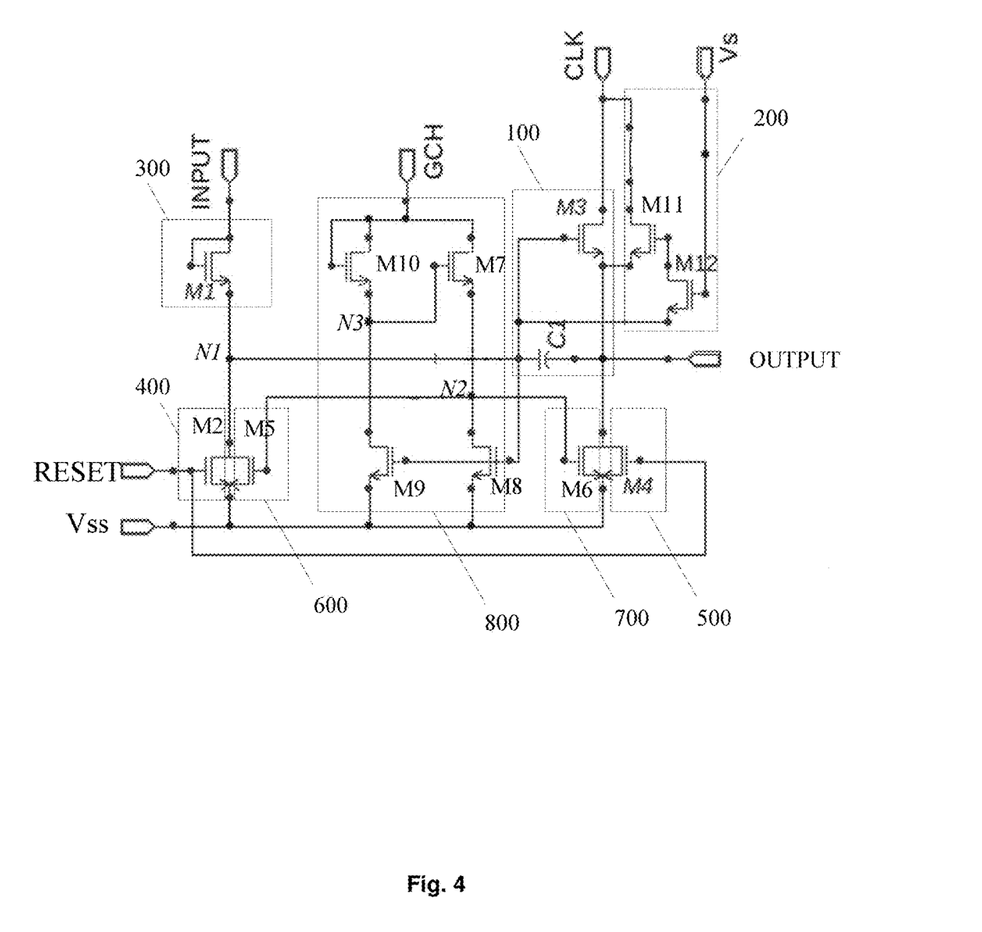
FIG. 4 is a diagram of a possible circuit structure of the shift register unit in FIG. 1.

As shown in FIG. 4, illustrated is a diagram of a further possible circuit structure of the shift register unit shown in FIG. 1. Compared with the circuit structure shown in FIG. 3, the circuit structure in FIG. 4 differs in that the auxiliary output module 200 therein does not comprise the thirteenth transistor M13, and the eleventh transistor M11 has one of the source and the drain connected to the scan pulse output terminal OUTPUT and the other of the source and the drain directly connected to the clock signal terminal CLK. In the shift register unit shown in FIG. 4, when the temperature control voltage terminal Vs is at a high level, a connection relationship of various electrode terminals of the eleventh transistor M11 also fits to that of the third transistor M3, and when the third transistor M3 outputs a scan pulse to the scan pulse output terminal OUTPUT, the eleventh transistor M11 also outputs a synchronous pulse to the scan pulse output terminal OUTPUT to be added to the scan pulse outputted by the third transistor M3 to form a scan pulse at a higher level. When the temperature control voltage terminal Vs is at a high level, a connection between the gate of the eleventh transistor M11 and the first node N1 cannot be conducted, and therefore the eleventh transistor M11 cannot be turned on to output a scan pulse to the scan pulse output terminal OUTPUT when the first node N1 is at a high level. Thus, the eleventh transistor M11 and the twelfth transistor M12 shown in FIG. 4 can also realize the functions of the auxiliary output module 200.

It is to be understood that in the circuit structures shown in FIGS. 3 and 4, both the twelfth transistor M12 and the thirteenth transistor M13 may be replaced with P-type transistors, and in this case, the valid level of the corresponding auxiliary output module is a low level.

Figure 5:
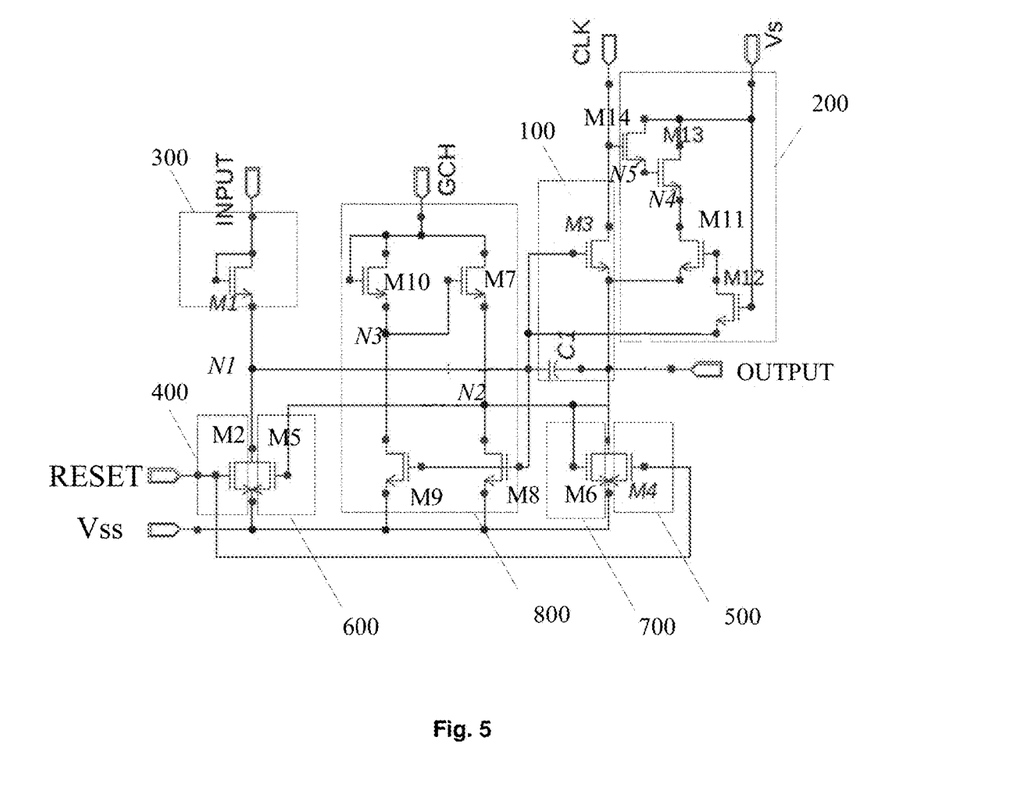
FIG. 5 is a diagram of a possible circuit structure of the shift register unit in FIG. 1.

As shown in FIG. 5, illustrated is a diagram of a further possible circuit structure of the shift register unit in FIG. 1. Compared with the circuit structure shown in FIG. 3, the circuit structure in FIG. 5 differs in that the auxiliary output module 200 comprises four N-type transistors, which are an eleventh transistor M11, a twelfth transistor M12, a thirteenth transistor M13, and a fourteenth transistor M14, wherein, the eleventh transistor M11 has one of a source and a drain connected to a fourth node N4, and the other of the source and the drain connected to the scan pulse output terminal OUTPUT;

the twelfth transistor M12 has a gate connected to the temperature control voltage terminal Vs, one of a source and a drain connected to a gate of the eleventh transistor M11, and the other of the source and the drain connected to the first node N1;

the thirteenth transistor M13 has a gate connected to a fifth node N5, one of a source and a drain connected to the fourth node N4, and the other of the source and the drain connected to the temperature control voltage terminal Vs; and the fourteenth transistor M14 has a gate connected to the clock signal input terminal CLK, one of a source and a drain connected to the temperature control voltage terminal Vs, and the other of the source and the drain connected to the fifth node N5.

In this way, when the temperature control voltage terminal Vs is at a high level (at this time, the high level is the valid level of the auxiliary output module 200) and the clock signal input terminal CLK is at a high level, the fourteenth transistor M14 is turned on, and then the fifth node N5 is set to a high level, which results in that the thirteenth transistor M13 is turned on. On the other hand, the temperature control voltage terminal Vs is at a high level, and then the twelfth transistor M12 is turned on. In this case, when the first node N1 is at a high level, the fourth node N4 is also set to a high level, and then the eleventh transistor M11 is turned on. In this way, a connection between the temperature control voltage terminal Vs and the scan pulse output terminal OUTPUT is conducted. Once one of the following three conditions is not satisfied, a connection between the temperature control voltage terminal Vs and the scan pulse output terminal OUTPUT is not conducted: the temperature control voltage terminal Vs is at a high level, the first node N1 is at a high level and the clock signal input terminal CLK is at a high level. That is, when the temperature control voltage terminal Vs is at a high level, the auxiliary output module 200 outputs a pulse at a high level which is synchronous with the third transistor M3 only if the first node N1 is at a high level and the clock signal input terminal CLK is at a high level, and does not output the corresponding pulse at a high level when the temperature control voltage terminal Vs is at a low level. Thus, the eleventh transistor M11, the twelfth transistor M12, the thirteenth transistor M13 and the fourteenth transistor M14 in FIG. 5 can also realize the functions of the auxiliary output module 200.

In the auxiliary output module 200 in the shift register unit shown in FIG. 5, when the temperature control voltage terminal Vs is at a high level, the voltage at the scan pulse output terminal OUTPUT is pulled high by the voltage at the temperature control voltage terminal Vs. The gate of the fourteenth transistor M14 is connected to the clock signal input terminal CLK, and the fourteenth transistor M14 functions only as a switch transistor, so that a size of the fourteenth transistor M14 can be designed to be small, and thereby the power consumption required for driving the clock signal input terminal CLK can be reduced (if the size of the fourteenth transistor M14 is too large, a large parasitic capacitance may be formed, and a large power consumption is required by a signal line connected to the transistor). In the manners shown in FIGS. 3 and 4, the sources or drains of the thirteenth transistor M13 and the eleventh transistor M11 are connected to the clock signal input terminal CLK, and the thirteenth transistor M13 and the eleventh transistor M11 functions as driving transistors, and if sizes thereof are designed to be too small, they cannot provide pulses at a high level well (a small size may lead to a large resistance of a transistor, which results in a large reduction in the voltage provided by the clock signal input terminal CLK through the transistor).

Figure 6:
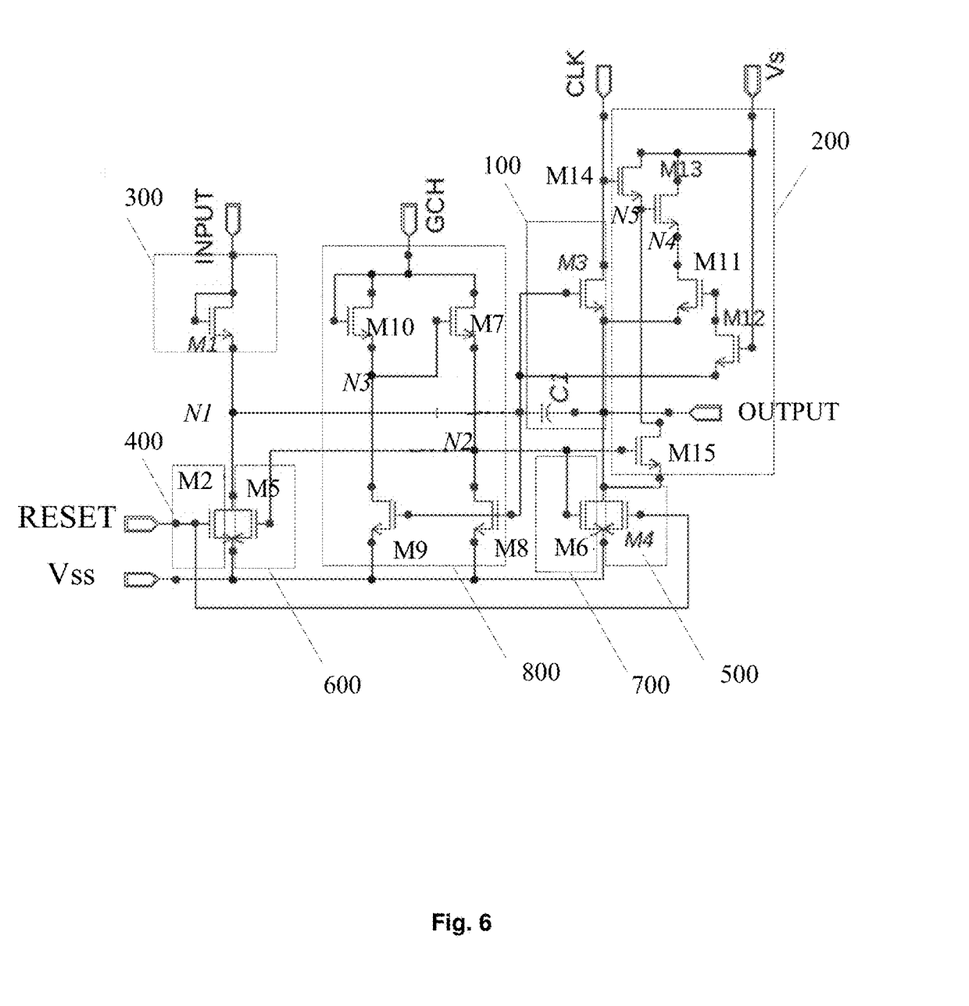
FIG. 6 is a diagram of a possible circuit structure of the shift register unit in FIG. 1.

As shown in FIG. 6, illustrated is a diagram of another possible circuit structure of the shift register unit in FIG. 1. Compared with the circuit structure in FIG. 5, the circuit structure in FIG. 6 differs in that the circuit structure further comprises a fifteenth transistor M15 having a gate connected to the second node N2, one of a source and a drain connected to the fifth node N5, and the other of the source and the drain connected to the scan pulse output terminal OUTPUT, wherein the fifteenth transistor is an N-type transistor.

Operation processes of the eleventh transistor M11, the twelfth transistor M12, the thirteenth transistor M13, and the fourteenth transistor M14 in the auxiliary output module 200 in the circuit structure shown in FIG. 6 is the same as the operation process of the auxiliary output module 200 in the shift register unit shown in FIG. 5, and it is understood from the description of the circuit structure in FIG. 5 that the eleventh transistor M11, the twelfth transistor M12, the thirteenth transistor M13, and the fourteenth transistor M14 in the circuit structure shown in FIG. 6 can also realize the functions of the corresponding auxiliary output module.

In FIG. 6, due to the presence of the fifteenth transistor M15, a connection between the fifth node N5 and the scan pulse output terminal OUTPUT is conducted when the second node N2 is at a high level and a connection between the scan pulse output terminal OUTPUT and the direct current low voltage terminal Vss is also conducted when the second node N2 is at a high level. As a result, a connection between the fifth node N5 and the direct current low voltage terminal Vss is also conducted, and thus the fifth node N5 is set to a low level. In this way, in other phases than the first phase S1 and the second phase S2 described above, the auxiliary output module 200 can consecutively set the thirteenth transistor M13 to a low level through the fifteenth transistor M15, which avoids the thirteenth transistor M13 from being turned on which influences the display and driving processes. Further, in the first phase S1 and the second phase S2 in which the second node N2 is at a low level, the fifteenth transistor M15 is turned off, which does not have a great influence on the voltage at the fifth node N5, and thus does not influence the implementations of basic functions by the auxiliary output module 200.

The embodiments of the present disclosure further provide a gate driving circuit comprising a plurality of cascaded shift register units, each of the shift register units being the shift register unit as described above.

In a specific implementation, a manner in which various shift register units are cascaded can be known with reference to the related art, and the description thereof will not be described here in detail.

The embodiments of the present disclosure further provide a display apparatus comprising the gate driving circuit as described above.

In a specific implementation, the display apparatus here may be any product or component having a display function such as an electronic paper, a mobile phone, a tablet computer, a television set, a display, a notebook computer, a digital photo frame, a navigator etc.

While the implementations of the present disclosure have been described with reference to the accompanying drawings, various modifications and variations can be made by those skilled in the art without departing from the spirit and scope of the present disclosure, and such modifications and variations are within the scope defined by the claims.

I claim:

1. A shift register unit, comprising:
   an output module connected to a first node, a clock signal input terminal and a scan pulse output terminal, and is adapted to output a scan pulse at a first level via the scan pulse output terminal when the first node and the clock signal input terminal are at the first level; and
   an auxiliary output module connected to the first node, the clock signal input terminal, the scan pulse output terminal and a temperature control voltage terminal, and is adapted to generate a pulse at the first level which is synchronous with the scan pulse and add the pulse at the first level to the scan pulse when both the first node and the clock signal input terminal are at the first level and the temperature control voltage terminal is at a valid level of the auxiliary output module.

2. The shift register unit according to claim 1, further comprising:
   an input module connected to the scan pulse input terminal and the first node, and is adapted to set the first node to the first level when the scan pulse input terminal is at the first level;
   a reset module connected to a reset control terminal and a direct current low voltage terminal and is adapted to set the first node to a second level when the reset control terminal is at the first level; and
   a restart module connected to the scan pulse output terminal, the direct current low voltage terminal and the reset control terminal, and is adapted to set the scan pulse output terminal to the second level when the reset control terminal is at the first level.

3. The shift register unit according to claim 2, wherein the input module comprises a first transistor having a gate connected to the scan pulse input terminal, one of a source and a drain connected to the scan pulse input terminal and the other of the source and the drain connected to the first node;
   the reset module comprises a second transistor having a gate connected to the reset control terminal, one of a source and a drain connected to the first node and the other of the source and the drain connected to the direct current low voltage terminal;
   the output module comprises a third transistor and a first capacitor, wherein the third transistor has a gate connected to the first node, one of a source and a drain connected to the clock signal input terminal and the other of the source and the drain connected to the scan pulse output terminal, and the first capacitor has one terminal connected to the first node and the other terminal connected to the scan pulse output terminal; and
   the restart module comprises a fourth transistor having a gate connected to the reset control terminal, one of a source and a drain connected to the scan pulse output terminal and the other of the source and the drain connected to the direct current low voltage terminal.

4. The shift register unit according to claim 2, further comprising: an enforcement reset module and a second node control module, wherein the enforcement reset module is connected to the first node, a second node and the direct current low voltage terminal, and is adapted to set the first node to a low level when the second node is at a high level; and the second node control module is connected to the first node, the second node, a high voltage terminal and the direct current low voltage terminal, and is adapted to set the second node to the second level when the first node is at the first level and set the second node to the first level when the first node is at the second level.

5. The shift register unit according to claim 4, wherein the enforcement reset module comprises a fifth transistor having a gate connected to the second node, one of a source and a drain connected to the direct current low voltage terminal, and the other of the source and the drain connected to the first node;

the second node control module comprises a seventh transistor, an eighth transistor, a ninth transistor and a tenth transistor, wherein the seventh transistor has a gate connected to a third node, one of a source and a drain connected to the high voltage terminal, and the other of the source and the drain connected to the second node, each of the eighth transistor and the ninth transistor has a gate connected to the first node, the eighth transistor has one of a source and a drain connected to the second node, and the other of the source and the drain connected to the direct current low voltage terminal, the ninth transistor has one of a source and a drain connected to the third node, and the other of the source and the drain connected to the direct current low voltage terminal, the tenth transistor has a gate and one of a source and a drain connected to the high voltage terminal, and the other of the source and the drain connected to the third node.

6. The shift register unit according to claim 2, further comprising: an enhancement restart module and a second node control module, wherein the enforcement restart module is connected to the second node, the scan pulse output terminal and the direct current low voltage terminal, and is adapted to set the scan pulse output terminal to the second level when the second node is at the first level; and the second node control module is connected to the first node, the second node, a high voltage terminal and the direct current low voltage terminal, and is adapted to set the second node to the second level when the first node is at the first level and set the second node to the second level when the first node is at the second level.

7. The shift register unit according to claim 4, further comprising: an enforcement restart module connected to the second node, the scan pulse output terminal and the direct current low voltage terminal, and is adapted to set the scan pulse output terminal to the second level when the second node is at the first level.

8. The shift register unit according to claim 6, wherein the enforcement restart module comprises a sixth transistor having a gate connected to the second node, one of a source and a drain connected to the scan pulse output terminal, and the other of the source and the drain connected to the direct current low voltage terminal.

9. The shift register unit according to claim 2, wherein the auxiliary output module comprises an eleventh transistor, a twelfth transistor and a thirteenth transistor; wherein the eleventh transistor has one of a source and a drain connected to a fourth node, and the other of the source and the drain connected to the scan pulse output terminal, the thirteenth transistor has one of a source and a drain connected to the fourth node, the other of the source and the drain connected to the clock signal input terminal, and a gate connected to the temperature control voltage terminal, and the twelfth transistor has a gate connected to the temperature control voltage terminal, one of a source and a drain connected to a gate of the eleventh transistor, and the other of the source and the drain connected to the first node.

10. The shift register unit according to claim 2, wherein the auxiliary output module comprises an eleventh transistor and a twelfth transistor, wherein the eleventh transistor has one of a source and a drain connected to the clock signal input terminal, and the other of the source and the drain connected to the scan pulse output terminal, and the twelfth transistor has a gate connected to the temperature control voltage terminal, one of a source and a drain connected to a gate of the eleventh transistor, and the other of the source and the drain connected to the first node.

11. The shift register unit according to claim 2, wherein the auxiliary output module comprises an eleventh transistor, a twelfth transistor, a thirteenth transistor and a fourteenth transistor, wherein the eleventh transistor has one of a source and a drain connected to a fourth node, and the other of the source and the drain connected to the scan pulse output terminal;

the twelfth transistor has a gate connected to the temperature control voltage terminal, one of a source and a drain connected to a gate of the eleventh transistor, and the other of the source and the drain connected to the first node;

the thirteenth transistor has a gate connected to a fifth node, one of a source and a drain connected to the fourth node, and the other of the source and the drain connected to the temperature control voltage terminal; and the fourteenth transistor has a gate connected to the clock signal input terminal, one of a source and a drain connected to the temperature control voltage terminal, and the other of the source and the drain connected to the fifth node.

12. The shift register unit according to claim 11, wherein the auxiliary output module further comprises a fifteenth transistor having a gate connected to the second node, one of a source and a drain connected to the fifth node, and the other of the source and the drain connected to the scan pulse output terminal.

13. The shift register unit according to claim 1, wherein the first level is a high level, and the second level is a low level.

14. A gate driving circuit comprising a plurality of cascaded shift register units, each of the shift register units being the shift register unit according to claim 1.

15. A method for driving the shift register unit according to claim 1, comprising:

setting the temperature control voltage terminal to the valid level of the auxiliary output module when it is detected that a temperature is lower than a preset value.

16. An apparatus for driving the shift register unit according to claim 1, comprising:

a temperature control module, configured to set the temperature control voltage terminal to the valid level of the auxiliary output module when it is detected that a temperature is lower than a preset value.

17. A display apparatus, comprising the gate driving circuit according to claim 14.

18. The shift register unit according to claim 7, wherein the enforcement restart module comprises a sixth transistor having a gate connected to the second node, one of a source and a drain connected to the scan pulse output terminal, and the other of the source and the drain connected to the direct current low voltage terminal.

19. The shift register unit according to claim 3, wherein the auxiliary output module comprises an eleventh transistor and a twelfth transistor, wherein the eleventh transistor has one of a source and a drain connected to the clock signal input terminal, and the other of the source and the drain connected to the scan pulse output terminal, and the twelfth transistor has a gate connected to the temperature control voltage terminal, one of a source and a drain connected to a gate of the eleventh transistor, and the other of the source and the drain connected to the first node.

20. The shift register unit according to claim 4, wherein the auxiliary output module comprises an eleventh transistor and a twelfth transistor, wherein the eleventh transistor has one of a source and a drain connected to the clock signal input terminal, and the other of the source and the drain connected to the scan pulse output terminal, and the twelfth transistor has a gate connected to the temperature control voltage terminal, one of a source and a drain connected to a gate of the eleventh transistor, and the other of the source and the drain connected to the first node.

* * * * *